United States Patent [19]

Kikuchi

[11] 3,983,420

[45] Sept. 28, 1976

[54] SIGNAL GENERATOR CIRCUIT

[75] Inventor: Tadao Kikuchi, Hinode, Japan

[73] Assignee: Hitachi, Ltd., Japan

[22] Filed: Aug. 28, 1975

[21] Appl. No.: 608,736

[30] Foreign Application Priority Data

Sept. 4, 1974 Japan .............................. 49-100926

[52] U.S. Cl. .............................. 307/279; 307/205; 307/247 R; 307/304

[51] Int. Cl.² .............................. H03K 3/26

[58] Field of Search ........ 307/205, 238, 246, 247 R, 307/279, 304

[56] References Cited

UNITED STATES PATENTS

| | | | |
|---|---|---|---|
| 3,510,689 | 6/1970 | Baker | 307/247 A |
| 3,753,011 | 8/1973 | Faggin | 307/279 |
| 3,858,061 | 12/1974 | Carpenter et al. | 307/279 |
| 3,870,901 | 3/1975 | Smith et al. | 307/304 |
| 3,892,985 | 7/1975 | Kawagoe | 307/279 |
| 3,895,239 | 7/1975 | Alaspa | 307/279 |
| 3,902,082 | 8/1975 | Proebsting et al. | 307/279 |

*Primary Examiner*—Stanley D. Miller, Jr.
*Attorney, Agent, or Firm*—Craig & Antonelli

[57] ABSTRACT

A signal generator circuit which assumes a certain prescribed value upon closure of a power supply and which is inverted upon lapse of a predetermined time after the closure of the power supply, comprising first and second flip-flops adapted to be firstly stabilized to one value upon the energization of the power supply, a logical product circuit, and memory means provided at one input of the logical product circuit, a first periodic pulse signal being applied to an inversion input terminal of the first flip-flop, an inversion output signal of the first flip-flop being written into the memory means in synchronism with a second periodic pulse signal different in phase from the first periodic pulse signal, the first periodic pulse signal being applied to the other input of the logical product circuit, an output of the logical product circuit being applied to an inversion input terminal of the second flip-flop, an inversion output signal of the second flip-flop being used as an output signal of the signal generator circuit.

7 Claims, 6 Drawing Figures

2 1 3 (E) (D) M9 M10 OUT M13 (D) M12 VDD M3 M4 (D) (E) M11 M7 M8 M14 M15 C CP2 M5 M1 M2 M6 WP

SIGNAL GENERATOR CIRCUIT

DETAILED DESCRIPTION OF THE INVENTION

This invention relates to a signal generator circuit, and it is chiefly devoted to an auto-clear signal generating circuit of a printer type electronic desk top calculator as constructed of insulated gate field-effect transistors (hereinbelow termed MISFET's).

A flip-flop circuit composed of two inverter circuits has two stable states, and is mainly utilized for a memory circuit. It is not definite, however, which state the flip-flop circuit is stabilized to at the energization of the power supply. Generally, in a device employing the flip-flop circuit as memory means, it has accordingly been necessary to clear meaningless memory contents of the flip-flop circuit as stored at the energization of the power supply. In particular, in a battery system portable electronic desk top calculator etc. in which the power supply is turned "on" and "off" at each time of use, it is troublesome to manually perform the clear operation subsequent to the energization of the power supply. For this reason, the function of automatically executing the clear operation at the energization of the power supply is desired.

For the auto-clear operation, there is considered a method in which a pulse is generated a certain time after the energization of the power supply and is used to effect the operation, or a method in which a clear signal is produced substantially at the same time as the energization of the power supply and is released by the output of the first numerical key or operation key to be manipulated.

With the former method, the pulse needs to be generated upon the stabilization of the flip-flop circuit after the energization of the power supply, and a capacitor with a comparatively large capacity is generally required in order to establish the long time constant. The method is unsuitable for small-sized electronic desk top calculators which are formed mostly of semiconductor integrated circuits.

Having studied the latter method in consideration of the above problem, it was found that a flip-flop circuit may be utilized which is adapted to be stabilized to one state whenever the power supply is turned "on". More specifically, the auto-clear operation is enabled in such manner that the one state to which the flip-flop circuit is first stabilized at (upon the energization of the power supply), is used as the clear signal and using the signal of the first key to be manipulated, the flip-flop is inverted to release the clear signal. Since such a flip-flop circuit requires no time-limit circuit or capacitor, it can be readily contained within a semiconductor integrated circuit.

Therefore, a flip-flop circuit which is always stabilized to one state at the energization of the power supply is necessitated, and the applicant has already made patent applications on flip-flop circuits to be described hereunder.

One circuit makes use of the threshold voltages of load MISFET's $M_3$ and $M_4$ as illustrated in FIG. 3(a), with its operation illustrated in FIG. 3(*b*). A supply voltage $V_{DD}$ is applied to the gate of the driving MISFET $M_1$ through the depletion type MISFET $M_4$, and to the gate of the driving MISFET $M_2$ through the enhancement type MISFET $M_3$. Owing to the threshold voltage of the load MISFET $M_3$, the driving MISFET $M_1$ reaches the operating voltage and becomes conductive earlier after the energization of the power supply. Thus, the flip-flop circuit is always stabilized to one state.

Another flip-flop circuit makes the threshold voltages of driving MISFET's $M_1$ and $M_2$ different as illustrated in FIG. 4(a) with its operation illustrated in FIG. 4(*b*). The driving MISFET $M_1$, having the smaller threshold voltage $V_{th1}$, reaches its operating voltage earlier after the energization of the power supply, so that the flip-flop circuit is always stabilized to one state.

Usually, a printer type electronic desk top calculator requires the printing operation of clearly indicating the clear state after the energization of the power supply. In this respect, the clearing system described above cannot be applied to the clear signal generating circuit of the printer type electronic desk top calculator because it releases the clear signal by the use of the signal of the key which is manipulated first. In other words, in the printer type electronic desk top calculator, the printing operation of clearly showing the clear state is performed upon the release of the clear signal, and it must be executed before depressing the key of the first manipulation. In the printer type electronic desk top calculator, accordingly, the clear release need be automatically carried out.

This invention has been made in order to solve the above problem, and its object is to provide a signal generator circuit which assumes a certain prescribed value at the energization of the power supply and which is inverted a predetermined time later.

The fundamental construction of this invention for accomplishing the object is characterized by comprising at least first and second flip-flops which are firstly stabilized to one value when the power supply is energized, memory means, a logical product circuit, and first and second pulse signals which arrive periodically and which differ in phase, the first pulse signal being applied to an inversion input terminal of the first flip-flop, an inversion output signal of this flip-flop being stored in synchronism with the second pulse signal by the memory means provided at one input of the logical product circuit, the first pulse signal being applied to the other input of the logical product circuit, an output thereof being applied to an inversion input terminal of the second flip-flop, an inversion output signal of the second flip-flop being made an output signal.

Hereunder this invention will be concretely explained along embodiments with reference to the drawing.

1, 2, 2' . . . flip-flops, 3, 3' . . . logical product circuits, $M_1 - M_{15}$ . . MISFET's, C. . capacitor.

Figure 1:
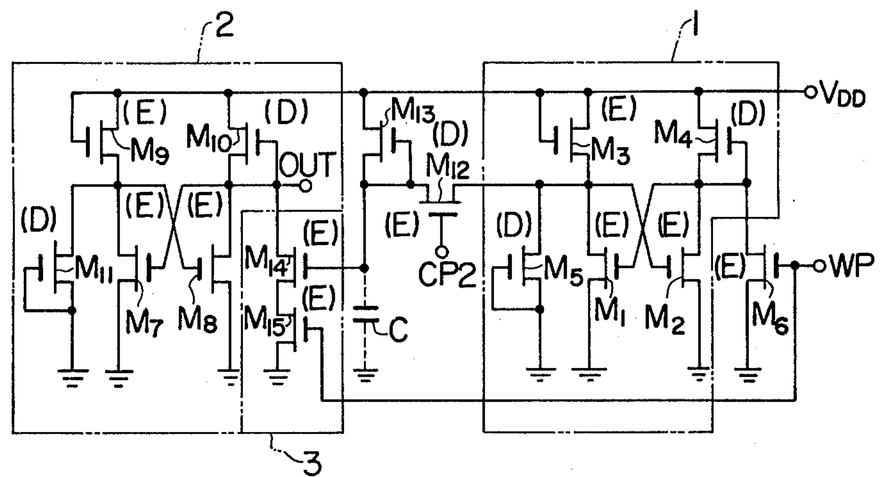
FIG. 1 is a circuit diagram showing an example of this invention.

FIG. 1 is a circuit diagram which shows an example in the case where this invention is applied to the auto-clear circuit of a printer type electronic desk top calculator.

The circuit operates as follows: flip-flops 1 ($M_1 - M_5$) and 2 ($M_7 - M_{11}$) are first stabilized to one value at the energization of the power supply as previously explained.

A word pulse WP is applied to the gate of a MISFET $M_6$ which is the inversion input terminal of the flip-flop 1, and the inverted output thereof is applied to the gate of a MISFET $M_{14}$, constituting a logical product circuit 3, through a transfer gate FET $M_{12}$ which is controlled by a clock pulse CP2. The word pulse WP is applied to the gate of another MISFET $M_{15}$ constituting the logical product circuit 3. A signal equal to the logical product of both the pulses is used as the inverted input signal of the flip-flop 2. The inverted output signal of the flip-flop 2 is used as the output signal.

In the figure, an affix (E) of the MISFET indicates an enhancement type MISFET, while (D) indicates a depletion type MISFET.

A depletion type MISFET $M_5$ ($M_{11}$) provided in the flip-flop 1 (2) rapidly discharges the charges accumulated in the gate capacity of the MISFET $M_2$ ($M_8$) in the case where the state to which the flip-flop is stabilized first, upon the energization of the power supply, is inverted, as in the situation where the power supply is de-energized and then energized a short time later. Thus, the MISFET $M_5$ ($M_{11}$) serves to prevent the erroneous operation of the flip-flop at the energization of the power supply. Likewise, a MISFET $M_{13}$ rapidly discharges, at the de-energization of the power supply, charges accumulated in the memory means which utilizes the gate capacity C of the MISFET $M_{14}$ constituting the logical product circuit 3, and it serves to prevent the erroneous operation due to the charges. This will become apparent from the ensuing explanation of the operation.

At the energization of the power supply, the flip-flops 1 and 2 are stabilized into the state in which the MISFET's $M_1$ and $M_7$ are conductive and the MISFET's $M_2$ and $M_8$ are nonconductive.

Thereafter, the flip-flop 1 has the MISFET $M_2$ inverted to the conductive state and the MISFET $M_1$ inverted to the nonconductive state by the word pulse WP which comes first.

Upon arrival of the clock pulse CP2 differing in phase from the word pulse WP, this inverted signal is written into the gate capacity C of the MISFET $M_{14}$ constituting the logical product circuit 3 and renders the MISFET $M_{14}$ conductive.

Subsequently, the other MISFET $M_{15}$ constituting the logical product circuit is rendered conductive by the word pulse WP which comes second. Therefore, the flip-flop 2 has the MISFET $M_8$ inverted into the conductive state and the MISFET $M_7$ inverted into the nonconductive state, and the auto-clear signal which is one output of the flip-flop 2 is automatically released.

In accordance with this invention as described above, the release of the auto-clear signal is logically determined, so that the time of the release can be accurately controlled and that the control circuit therefor can be contained within a semiconductor integrated circuit.

This invention is not restricted to the foregoing embodiment, but it can adopt various aspects of performance.

Figure 2:
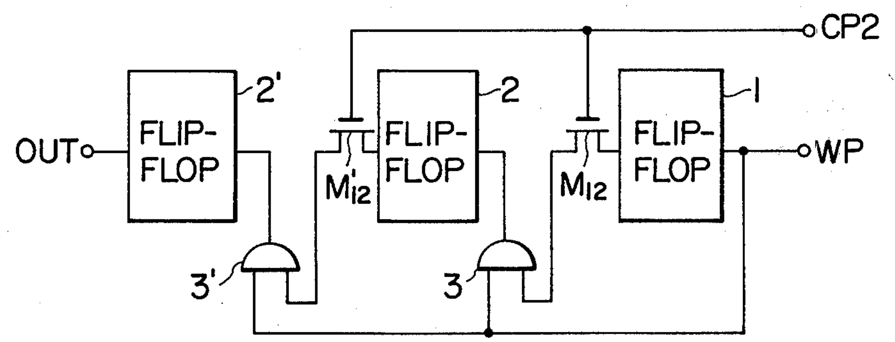
FIG. 2 is a block diagram showing another example.
Figure 3A:
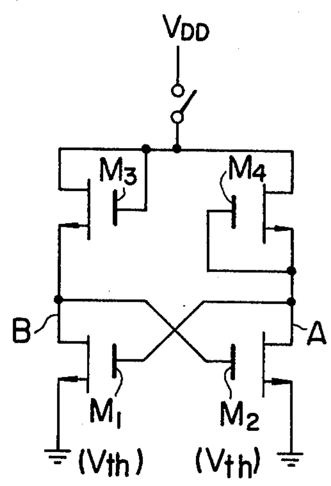
FIGS. 3(*a*) and 4(*a*) are circuit diagrams of flip-flops, respectively, while FIGS. 3(*b*) and 4(*b*) are operation diagrams of the flip-flops.
Figure 3B:
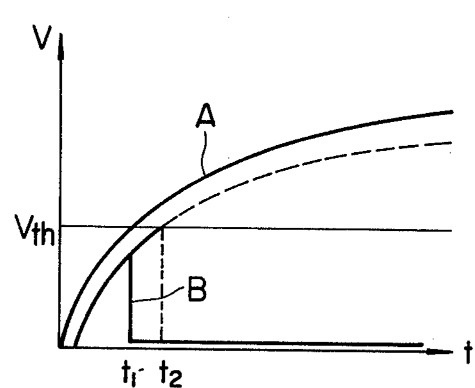
Figure 4A:
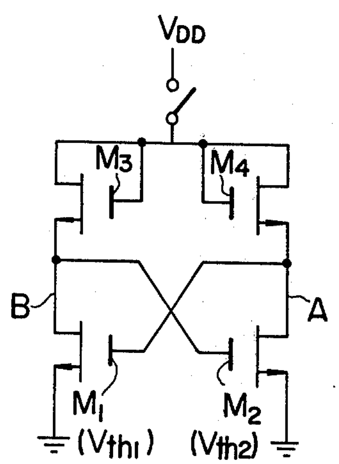
Figure 4B:
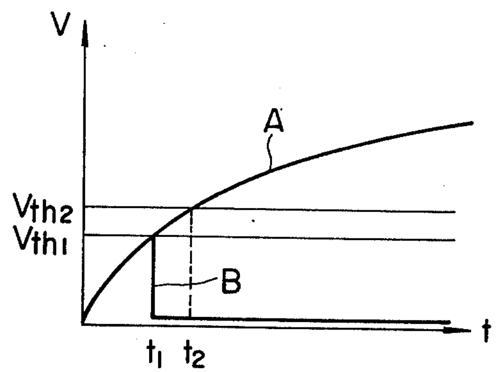

For example, the circuit arrangement of the flip-flop may be any insofar as it is firstly stabilized to one value at the closure of the power supply. With flip-flops 1, 2 and 2' as shown in FIG. 2, the clear releasing operation can be effected by the word pulse WP which comes third. Likewise, when *n* flip-flops are provided, the clear releasing operation can be effected by the nth word pulse WP. The time setting can accordingly be selected appropriately.

It will be readily understood that this invention can be similarly performed using bipolar transistors instead of the insulated gate field-effect transistors. It is to be noted that another circuit, such as a flip-flop, may be utilized as the memory means.

Further, the pulse signals may be any ones insofar as they differ in phase from each other.

This invention can be extensively utilized, not only for the auto-clear circuit, but also for a signal generator circuit which generates a signal after the lapse of a certain period from the time of the energization of a power supply.

What is claimed is:

1. A signal generator circuit characterized by comprising at least first and second flip-flops which are first stabilized to one value when a power supply is energized, memory means, a logical product circuit, and first and second pulse signals which arrive periodically and which differ in phase, said first pulse signal being applied to an inversion input terminal of said first flip-flop, an inversion output signal of this flip-flop being stored in synchronism with said second pulse signal by said memory means provided at one input of said logical product circuit, said first pulse signal being applied to the other input of said logical product circuit, an output thereof being applied to an inversion input terminal of said second flip-flop, an inversion output signal of said second flip-flop being made an output signal.

2. A signal generator comprising:

a power supply;

first and second periodic pulse signal sources being of different phases;

a first flip-flop, and at least one additional flip-flop, wherein a predetermined stable state occurs upon the energization of said power supply;

a plurality of logical product circuits each having one input connected to said first pulse source and each having its output connected to the input of its respective additional flip-flop;

a plurality of memory means, each having its write input connected to said second pulse source, its data input being connected to the output of its respective flip-flop, and its output connected to the second input of said respective logical product circuit;

said first pulse source being connected to the input of said first flip-flop;

wherein the output signal is obtained from the output terminal of the last additional flip-flop.

3. A signal generator as in claim 2, wherein said flip-flops are formed from cross-connected insulated gate field effect transistors, and the transistor loads are constructed from an additional pair of insulated gate field effect transistors, one of which being of the enhancement type and the other of the depletion type.

4. A signal generator as in claim 2, wherein said logical product circuit is formed from a pair of series connected insulated gate field effect transistors.

5. A signal generator as in claim 2, wherein the memory means comprises an insulated gate field effect transistor having an additional insulated gate field effect transistor as its load element.

6. A signal generator as in claim 3, wherein an additional depletion type insulated gate field effect transistor is connected from said flip-flop output terminal to said power supply return terminal.

7. A signal generator comprising:

a power supply;

first and second periodic pulse signal sources being of different phases;

a first and a second flip-flop, each composed of cross-connected insulated gate field effect transistors with the transistor loads being composed of an additional pair of insulated gate field effect transistors, one of which being of the enhancement type and the other of the depletion type;

a logical product circuit, composed of two series connected insulated gate field effect transistors, with the gate of one transistor connected to said first pulse source and the gate of the second transistor connected through a memory circuit means to the output terminal of the first flip-flop, and the output of the logical product circuit connected to the input terminal of the second flip-flop;

said memory circuit means being composed of an insulated gate field effect transistor having its gate connected to said second pulse signal source and using an additional insulated gate field effect transistor as its load element;

an additional two depletion type insulated gate type field effect transistors each of which is connected between the output terminals of one of said flip-flops to said power supply return terminal;

wherein said first pulse source being connected to the input of the first flip-flop and the output signal is obtained from the output terminal of the second flip-flop.

* * * * *